(12) United States Patent
Giovannini

(10) Patent No.: US 11,487,314 B2
(45) Date of Patent: Nov. 1, 2022

(54) METHOD FOR SUPPLY VOLTAGE REGULATION AND CORRESPONDING DEVICE

(71) Applicant: STMicroelectronics (Grenoble 2) SAS, Grenoble (FR)

(72) Inventor: Michael Giovannini, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 17/412,816

(22) Filed: Aug. 26, 2021

(65) Prior Publication Data
US 2021/0389792 A1 Dec. 16, 2021

Related U.S. Application Data

(63) Continuation of application No. 16/879,126, filed on May 20, 2020, now Pat. No. 11,132,016.

(30) Foreign Application Priority Data

May 20, 2019 (FR) ..................................... 1905246

(51) Int. Cl.
*G06F 1/08* (2006.01)
*H03L 7/097* (2006.01)

(52) U.S. Cl.
CPC ................ *G06F 1/08* (2013.01); *H03L 7/097* (2013.01)

(58) Field of Classification Search
None
See application file for complete search history.

(56) References Cited

U.S. PATENT DOCUMENTS

| 11,132,016 B2* | 9/2021 | Giovannini ............... G06F 1/08 |
| 2011/0169578 A1 | 7/2011 | Lucas et al. |
| 2015/0198966 A1 | 7/2015 | Lee et al. |
| 2015/0268678 A1 | 9/2015 | Yu et al. |
| 2020/0244274 A1 | 7/2020 | Sathe |

FOREIGN PATENT DOCUMENTS

EP 3332302 6/2018

* cited by examiner

*Primary Examiner* — Cassandra F Cox
(74) *Attorney, Agent, or Firm* — Slater Matsil, LLP

(57) ABSTRACT

An embodiment method for modifying the frequency of a clock signal clocking an integrated circuit supplied by a voltage controller comprises, in response to a command for the modification, varying the frequency of the clock signal at a rate allowing a supply voltage to be controlled by the controller. The variation comprises at least one series of successive divisions of the frequency of the clock signal into successive intermediate signals of respective intermediate frequencies.

23 Claims, 2 Drawing Sheets

METHOD FOR SUPPLY VOLTAGE REGULATION AND CORRESPONDING DEVICE

CROSS-REFERENCE TO RELATED APPLICATIONS

This application is a continuation of U.S. patent application Ser. No. 16/879,126, filed May 20, 2020, which application claims priority to French Application No. 1905246, filed on May 20, 2019, all of which applications are hereby incorporated herein by reference.

TECHNICAL FIELD

Modes of implementation and embodiments relate to integrated circuits, in particular integrated circuits having a supply voltage controller and a commandable clock generator.

BACKGROUND

A supply voltage controller is normally configured so as to supply a stable supply voltage to an attached device, equivalent to a load from the perspective of the controller.

That being said, the load may vary depending on the activity of the attached device. The variation in the load may be fast, to the point that the response of the controller is too slow to control the supply voltage. This is the case in particular for controllers that have only a relatively low internal capacitance, or controllers that do not have a dedicated external capacitive element.

This is reflected in phenomena of overshooting of the supply voltage in the event of an abrupt decrease in the load (overshoot), and of undershooting of the supply voltage in the event of an abrupt increase in the load (undershoot).

Upon overshoots and undershoots, the supply voltage may exceed operating limits of the device supplied by the controller, which may be dangerous for the devices that are supplied.

A variation in activity of the attached device, and therefore a variation in the equivalent load and a risk of overshooting or undershooting of the supply voltage, occurs in particular when modifying the frequency of a clock signal. The modification of the frequency of the clock signal may be commanded for example by a user.

Specifically, clock signals are conventionally generated by devices that need to be shut down completely before restarting with a new frequency. During the restart, a low-frequency clock signal, for example at 4 MHz or 16 MHz, generated by an elementary generator, is substituted for the clock signal.

Therefore, even though the variation in the commanded frequency change is theoretically not high enough to bring about supply voltage overshoots or undershoots (for example a variation of 30 MHz to change from 170 MHz to 140 MHz, from the initial frequency to the modified frequency), the variations from the initial clock frequency to the substitute clock frequency and then to the modified clock frequency, which have higher amplitudes, may each lead to overshooting or undershooting of the supply voltage.

It has been proposed to divide the frequencies of the clock signal upon each of said transitions, by way of a conventional frequency divider whose division ratio is a half (½), that is to say a frequency divider that is able to divide only by powers of 2.

However, for clock frequencies greater than 120 MHz, dividing the frequency by 2 still causes a significant amplitude variation, greater than 60 MHz, which may cause overshooting or undershooting of the supply voltage.

Now, it is desirable to increase clock signal frequencies without otherwise introducing overshooting or undershooting of the supply voltage when modifying the frequency of the clock signal.

SUMMARY

According to one aspect, what is proposed is a method for modifying the frequency of a clock signal, the clock signal clocking an integrated circuit supplied by a voltage controller, comprising, in response to a command for said modification, varying the frequency of the clock signal, comprising at least one series of successive divisions of the frequency of the clock signal into successive intermediate signals of respective intermediate frequencies, said at least one series being configured so as to allow a supply voltage to be controlled by said controller.

In other words, it is proposed to control the supply voltage, that is to say to prevent overshooting and undershooting of the supply voltage, in the event of a modification of the frequency of the clock signal, by using at least one series of divisions of the frequency of the clock signal, so as to standardize the variation in the frequency. Said at least one series of successive divisions therefore comprises a plurality of successive divisions of the frequency of the clock signal, and advantageously at least three divisions.

Standardizing the variation via said series thus makes it possible to adapt to the response time of the controller and not to bring about any supply voltage overshoot or undershoot.

Furthermore, this method may adapt to any type of existing controller that may benefit from various advantages so as to be able to use these controllers and benefit from their advantages at higher clock frequencies without having to modify the design of the controllers.

According to one mode of implementation, the ratio of each division of said at least one series varies from one division to another so as not to lead to a frequency differential that is greater than a limit between two successive frequencies of the series.

Specifically, as the divisions have a variable ratio, this mode of implementation makes it possible to start dividing a high frequency with a lower ratio, for example 1/10 or 1/8, and to gradually increase the division ratios of the series until reaching or approaching the desired frequency.

Advantageously, the limit is strictly less than half the frequency of the clock signal.

For example, the tolerated limit of the frequency differential may be between 45 MHz and 60 MHz, for example 50 MHz, and the frequencies of the clock signal may be greater than 150 MHz.

According to one mode of implementation, each frequency division comprises periodically subtracting a first number of pulses per group from a second number of pulses of the clock signal, such that the ratio of the first number to the second number defines the division ratio of each division.

In other words, to divide the frequency by a ratio N/D, the clock signal is transmitted by periodically blocking N pulses thereof in groups of D pulses. Or in yet other words, to generate the intermediate signals, the form of the pulses of the clock signal is not modified (this being the case for conventional dividers), but the number of pulses of the clock signal is modified.

This mode of implementation corresponds to a numerical frequency division, and is advantageous in terms of ease of implementation, effectiveness and controlled setting. That being said, in this case, the intermediate signals risk not being functionally able to command certain actions, in particular actions with synchronous operation, and particular attention should be paid to the actions executed during the transient state.

The frequency of the clock signal is modified from an initial frequency to a final frequency, and said variation may comprise a decreasing series of divisions of the initial frequency of the clock signal, restarting the generation of the clock signal at the final frequency, and then an increasing series of divisions of the final frequency of the clock signal.

Said at least one series thus comprises two series of divisions, one on the initial frequency and the other on the final frequency.

Upon restart, a substitute clock signal may be generated separately.

According to another aspect, what is proposed is an integrated circuit comprising a supply voltage controller, a clock signal generator able to receive a command to modify the frequency of the clock signal, and a frequency divider configured so as, in response to said command, to vary the frequency of the clock signal with at least one series of successive divisions of the frequency of the clock signal into successive intermediate signals of respective intermediate frequencies, such that said at least one series is configured so as to allow a supply voltage to be controlled by said controller.

According to one embodiment, the frequency divider is configured such that the division ratio of each division of said at least one series varies from one division to another so as not to lead to a frequency differential that is greater than a limit between two successive frequencies of the series.

For example, said limit is strictly less than half the frequency of the clock signal.

According to one embodiment, the frequency divider is configured such that said at least one series of successive divisions comprises at least three divisions.

According to one embodiment, the frequency divider comprises a first counter-comparator for a first number able to be set in a register, and a second counter-comparator for a second number able to be set in a register, the first counter-comparator and the second counter-comparator being jointly configured so as to periodically subtract the first number of pulses per group from the second number of pulses of the clock signal, such that the ratio of the first number to the second number defines the division ratio of each division.

According to one embodiment, said command commanding a modification of the frequency of the clock signal from an initial frequency to a final frequency, the frequency divider is configured so as to vary the frequency of the clock signal with a decreasing series of divisions of the initial frequency of the clock signal, the clock signal generator is configured so as then to restart the generation of the clock signal at the final frequency, and the frequency divider is configured so as then to vary the frequency of the clock signal with an increasing series of divisions of the final frequency of the clock signal.

BRIEF DESCRIPTION OF THE DRAWINGS

Other advantages and features of the invention will become apparent upon examining wholly non-limiting embodiments and modes of implementation and the appended drawings, in which.

DETAILED DESCRIPTION OF ILLUSTRATIVE EMBODIMENTS

Figure 1:
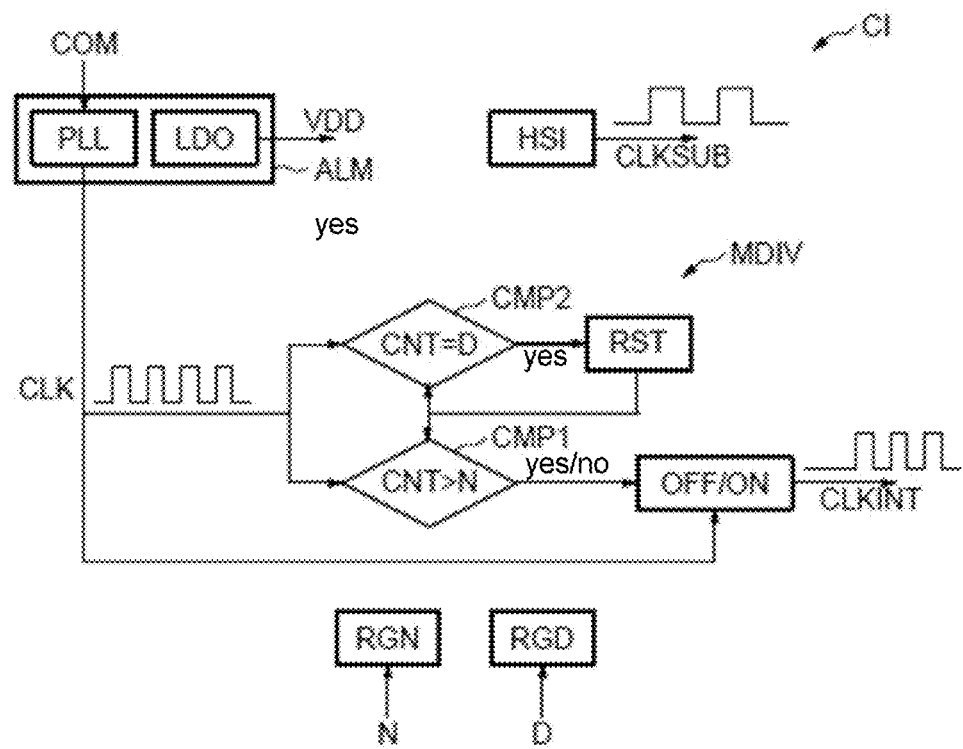
FIG. 1 schematically illustrates an example of an embodiment integrated circuit.

FIG. 1 schematically illustrates an example of an integrated circuit CI having a supply stage ALM configured so as to control a supply voltage VDD in the event of a command to modify the frequency of a clock signal CLK.

The supply stage ALM has a supply voltage controller LDO and a clock signal generator PLL interacting with one another in order to supply an attached circuit, for example a circuit with a given function incorporated or not incorporated into the same chip as the integrated circuit CI.

The clock signal generator PLL generates the clock signal CLK, and is able to receive the command COM to modify the frequency of the clock signal. The command COM may be issued for example by a user of the integrated circuit CI or else by a master device capable of commanding the integrated circuit CI.

For example, the frequency of the clock signal may be commanded at a value between 100 MHz and 200 MHz.

That being said, the clock signal generator PLL may be of phase-locked loop type and typically requires restarting in order to modify the frequency of the clock signal to be generated, that is to say requires its operation to be shut down and requires resetting at the new modified frequency.

Upon restarting, and therefore during a pause in the generation of the clock signal, an internal oscillator HSI configured so as to independently generate a low-frequency clock signal, for example at 16 MHz, supplies a substitute clock signal CLKSUB so as not to interrupt the distribution of a clock signal.

The supply voltage controller LDO is for its part configured so as to generate the controlled supply voltage VDD, kept constant regardless of the load at output, within a certain limit.

Specifically, a large variation in the frequency of the clock signal is equivalent to a variation in the load at the output of the supply voltage controller that may be beyond its capacitance.

In particular, the supply voltage controller LDO may not be equipped with an external capacitive element capable of withstanding such variations. This is the case for example for controllers using their internal capacitance, that is to say the capacitance defined by the structurally formed capacitive structures of the various components incorporated into the integrated circuit; this internal capacitance is not specifically designed to withstand high load variations.

The integrated circuit CI is equipped with frequency divider MDIV for avoiding a variation in the frequency of the clock signal CLK that is too abrupt for the capacitance of the supply voltage controller LDO.

Generally speaking, the frequency divider MDIV is configured so as to modify the frequency of the clock signal CLK with at least one series of successive divisions of the frequency of the clock signal into successive intermediate signals CLKINT of respective intermediate frequencies f1-f6.

As will be described in more detail hereafter, this makes it possible to standardize the variation in the frequency, using steps at intermediate frequencies decreasing as far as the substitute frequency, and then at frequencies increasing as far as the new modified frequency of the clock signal.

Of course, the increases and decreases are configured so as to be uniform, that is to say have elementary variations (between two consecutive steps) less than a limit value, for the purpose of standardizing the overall variation in the frequency of the clock signal.

The frequency divider MDIV is thus configured such that the division ratio N/D of each division of said at least one series varies from one division to another.

In this example, the frequency divider MDIV to this end comprises a first counter-comparator CMP1 and a second counter-comparator CMP2 that are configured so as to count the pulses of the clock signal CLK and to compare their respective counts CNT with a respective number N, D.

The first counter-comparator CMP1 is configured so as to indicate whether the counted pulse total of the clock signal CLK is less than or equal to or strictly greater than a first number N. For example, the first counter-comparator CMP1 delivers a "yes" signal, such as a logic "1", if the total is strictly greater than the first number N, and a "no" signal, such as a logic "0", if not.

The second counter-comparator CMP2 is capable of detecting the occurrence of a second number D of pulses of the clock signal CLK in the counted total.

The numbers N and D are able to be set in respective registers RGN, RGD.

The output of the second counter-comparator CMP2 makes it possible to trigger a reset RST of the two counter-comparators CMP1, CMP2 when D pulses have been counted in the clock signal CLK. When it is reset, the first counter-comparator CMP1 and the second counter-comparator CMP2 restart their pulse counts from 0.

The output of the first counter-comparator CMP1 for its part commands a device for transmitting the clock signal that is capable, upon each pulse of the clock signal CLK, either of transmitting the pulse "ON" or of inhibiting the pulse "OFF".

As long as the first counter-comparator CMP1 detects that the count is less than or equal to the first number N, inhibition of the corresponding pulse is commanded, whereas, if it is detected that the count is strictly greater than the first number N, then transmission of the pulse is commanded.

The device for transmitting the clock signal may thus be formed by a logic AND gate, having the output of the first counter-comparator CMP1 and the clock signal CLK at input (the high levels of the pulses of the clock signal being assimilated to logic "1"s, the low levels of the pulses of the clock signal being assimilated to logic "0"s, a comparison less than or equal to N outputting a logic "0", and a comparison strictly greater than N outputting a logic "1").

The pulse sequence that is thus transmitted forms an intermediate signal CLKINT having an intermediate frequency.

Figure 2:
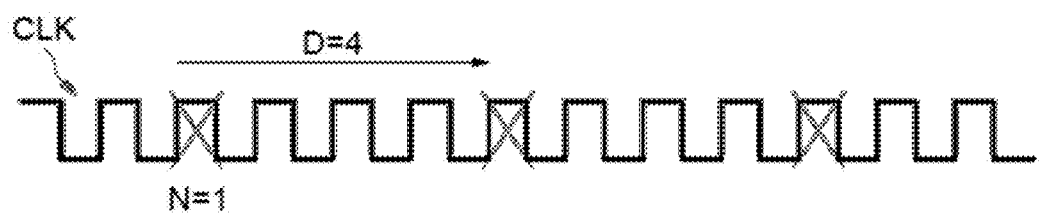
FIG. 2 illustrates a timing diagram for a clock signal.

Reference is made to FIG. 2, which illustrates the case in which N=1 and D=4 for the frequency divider on a clock signal CLK.

The first counter-comparator CMP1 and the second counter-comparator CMP2 as described above are therefore jointly configured so as to periodically subtract the first number N=1 pulses in successive groups from the second number D=4 pulses of the clock signal CLK.

Thus, N/D=1/4 of the pulses of the clock signal are inhibited, and this corresponds to subtracting N/D=1/4 of its value from the frequency of the clock signal CLK. In other words, the frequency is multiplied by 1-N/D=3/4 in this example.

The ratio of the numbers N/D thus defines the division ratio of each division. The division ratio of a division specifically corresponds to the amount of the frequency differential resulting from the division, on the initial frequency that is divided.

Figure 3:
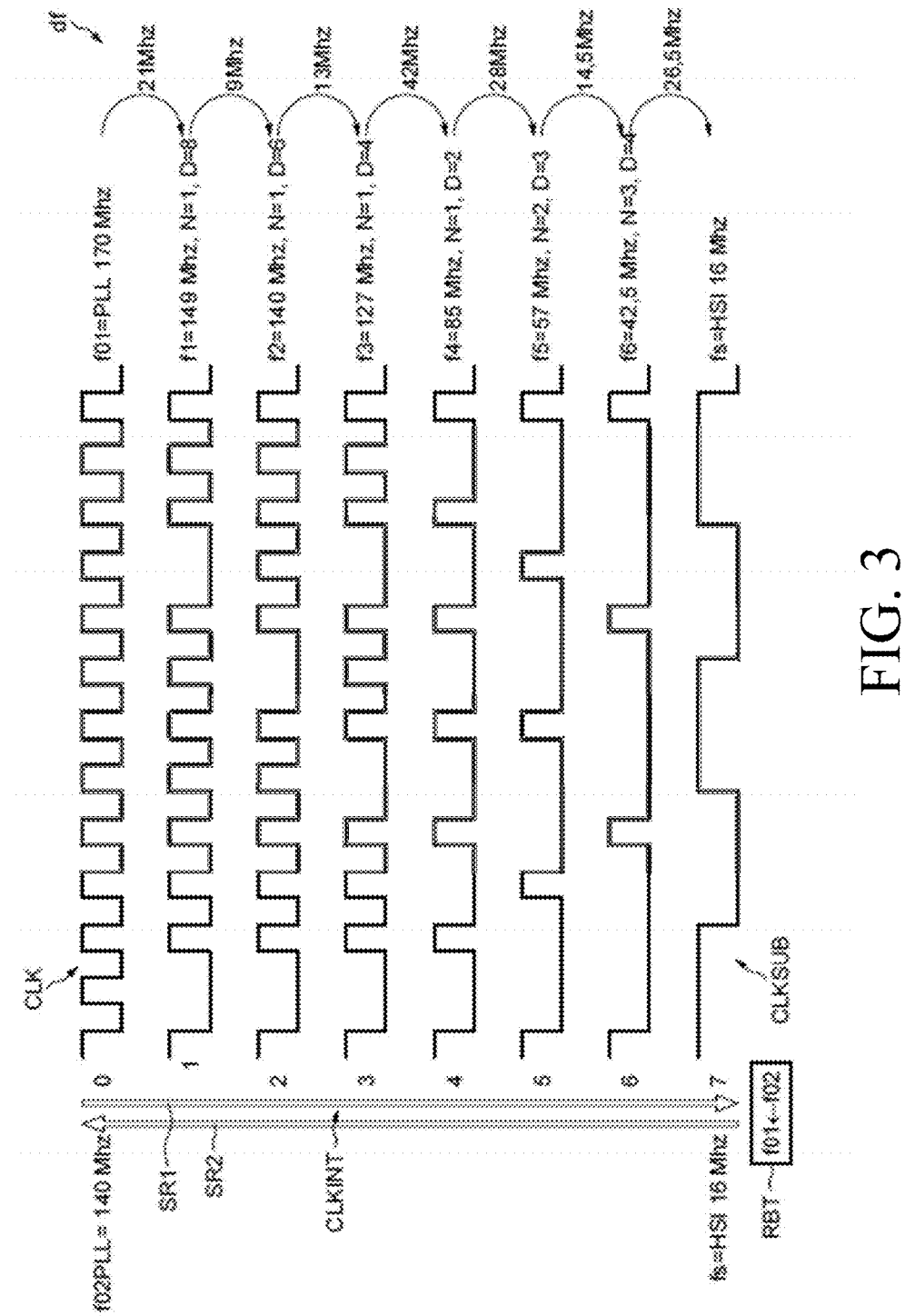
FIG. 3 illustrates a timing diagram for modifying the frequency of the clock signal.

FIG. 3 illustrates one exemplary implementation of modifying the frequency f01 of the clock signal CLK to a modified frequency foe, using a substitute clock signal CLKSUB at a frequency fs lower than the frequencies of the clock signal.

In this example, the initial clock signal CLK is generated at a frequency f01 of 170 MHz by the clock signal generator PLL.

Modifying the frequency comprises a decreasing series SR1 of successive divisions 1-6 of the frequency f01 of the clock signal CLK.

Upon each division 1-6 of the series SR1, a respective intermediate signal CLKINT at an intermediate frequency f1-f6 results from the division of the frequency f01 by a respective division ratio.

The series SR1 is said to be decreasing since the intermediate frequencies f1-f6 decrease (whereas the successive division ratios increase).

The first division 1 of the series SR1 is set at N=1 and D=8, for a division ratio at 1/8, and forms the first intermediate signal at an intermediate frequency f1=f0=f01*7/8=1.49 MHz. The frequency differential df from f01 to f1 has the value 170−149=21 MHz.

The second division 2 of the series SR1 is set at N=1 and D=6, for a division ratio at 1/6, and forms the second intermediate signal at an intermediate frequency f2=f01*5/6=140 MHz. The frequency differential df from f1 to f2 has the value 149−140=9 MHz.

The third division 3 of the series SR1 is set at N=1 and D=4, for a division ratio at 1/4, and forms the third intermediate signal at an intermediate frequency f3=f01*3/4=127 MHz. The frequency differential df from f2 to f3 has the value 140−127=13 MHz.

The fourth division 4 of the series SR1 is set at N=1 and D=2, for a division ratio at 1/2, and forms the fourth intermediate signal at an intermediate frequency f4=f01*1/2=85 MHz. The frequency differential df from f3 to f4 has the value 127−85=42 MHz.

The fifth division 5 of the series SR1 is set at N=2 and D=3, for a division ratio at 2/3, and forms the fifth intermediate signal at an intermediate frequency f5=f01*1/3=57 MHz. The frequency differential df from f4 to f5 has the value 85−57=28 MHz.

The sixth division 6 of the series SR1 is set at N=3 and D=4, for a division ratio at 3/4, and forms the sixth intermediate signal at an intermediate frequency f6=f01*1/4=42.5 MHz. The frequency differential df from f5 to f6 has the value 57−42.5=14.5 MHz.

The transition to the low frequency fs of 16 MHz of the substitute clock signal CLKSUB is then performed at a frequency differential f6−f5=26.5 MHz.

This example corresponds to a configuration of the division ratios N/D of each division of the series SR1 making it possible not to create a frequency differential df that is greater than a limit, for example a limit of 45 MHz, between two successive frequencies fi,fi+1 of the series.

The method described here makes it possible to choose the value of the limit in a manner matched to the capacitance of the voltage controller LDO of the integrated circuit, and is thus compatible with any type of voltage controller LDO for high frequencies, for example of the order of 100 MHz to 200 MHz, without the voltage controller LDO otherwise having initially been designed for this type of frequency.

Generally speaking, it is advantageous to position the limit strictly below half the frequency of the clock signal.

Moreover, after the decreasing series SR1 of divisions of the frequency of the clock signal f01, when the substitute clock signal supplies the integrated circuit CI, the clock signal generator PLL is able to restart RBT in order to generate a new clock signal CLK at a modified frequency foe. For example, the modified frequency foe has been commanded at 140 MHz.

After said restart RBT, an increasing series SR2 of divisions of the modified frequency foe of the clock signal CLK is performed analogously to the series SR1 in the opposite direction, that is to say starting with divisions of the modified frequency at high division ratios, for example 3/4, and reducing the ratios until reaching a frequency differential that is less than said limit between the last intermediate signal of the increasing series SR2 and the modified clock signal.

What have thus been described are exemplary implementations and embodiments for controlling a supply voltage by standardizing a variation in the frequency of a clock signal by way of a series of frequency divisions having variable division ratios.

The division ratios of a series are configured such that the modification of the frequency of the clock signal exhibits a uniform overall variation, that is to say for example that each frequency differential between two successive intermediate signals is always less than a limit value.

Standardizing the variation in the frequency of the clock signal thus makes it possible to adapt the execution of the frequency modification to the response time of the controller, and not to bring about supply voltage overshoots and undershoots, this being the case for any type of controller.

Moreover, the invention is not limited to these embodiments, but incorporates all variants thereof; for example, the number of divisions in the series, like the values of the division ratios, of course make it possible to adapt the method to various situations, in particular depending on the frequencies involved and on the capacitance of the controller, or else the structure of the frequency divider has been presented by way of example, and any functionally analogous structure may be contemplated.

What is claimed is:

1. An integrated circuit comprising:
a supply voltage controller configured to control a supply voltage provided to the integrated circuit;
a clock signal generator configured to generate a first clock signal, and to receive a command to modify a frequency of the first clock signal; and
a frequency divider comprising:
a first counter-comparator configured to receive the first clock signal and a reset signal, and to generate a gating signal;
a second counter-comparator configured to receive the first clock signal and the reset signal, and to generate the reset signal; and
a gating device configured to receive the first clock signal and the gating signal, and to generate a gated clock signal for clocking the integrated circuit.

2. The integrated circuit according to claim 1, wherein the first counter-comparator is configured to:
count pulses of the first clock signal;
activate the gating signal in response to a number of the pulses being less than or equal to a number N; and
inhibit the gating signal in response to the number of the pulses being strictly greater than the number N.

3. The integrated circuit according to claim 2, wherein the second counter-comparator is configured to:
count the pulses of the first clock signal; and
in response to the number of the pulses being greater than a number D, generate the reset signal to reset the first and second counter-comparators.

4. The integrated circuit according to claim 3, further comprising respective registers storing the number N and the number D.

5. The integrated circuit according to claim 3, wherein the gating device is configured to:
inhibit the gated clock signal in response to the gating signal being active; and
generate the gated clock signal in response to the gating signal being inhibited.

6. The integrated circuit according to claim 3, wherein the gating device is a logic AND gate.

7. The integrated circuit according to claim 3, wherein the frequency divider is configured to, in response to the command, vary the frequency of the gated clock signal with at least one series of successive divisions of the frequency of the first clock signal into successive intermediate signals of respective intermediate frequencies, wherein each division of the at least one series is configured to be limited so as to limit a load variation presented by the integrated circuit to the supply voltage controlled by the supply voltage controller.

8. The integrated circuit according to claim 7, wherein the frequency divider is configured such that a division ratio of each division of the at least one series varies from one division to another so as to avoid a frequency differential that is greater than a frequency differential limit between two successive frequencies of the series.

9. The integrated circuit according to claim 8, wherein a ratio of the number N to the number D determines the division ratio of each division.

10. The integrated circuit according to claim 8, wherein the frequency differential limit is strictly less than half the frequency of the first clock signal.

11. The integrated circuit according to claim 7, wherein the frequency divider is configured such that the at least one series of successive divisions comprises at least three divisions.

12. The integrated circuit according to claim 7, wherein the command commands a modification of the frequency of the gated clock signal from an initial frequency to a final frequency, the frequency divider is configured so as to vary the frequency of the gated clock signal with a decreasing series of divisions of the initial frequency of the first clock signal, the clock signal generator is configured so as then to restart generation of the gated clock signal at the final frequency, and the frequency divider is configured so as then to vary the frequency of the gated clock signal with an increasing series of divisions of the final frequency of the first clock signal.

13. The integrated circuit according to claim 7, wherein the limit of the load variation avoids overshoot or undershoot of the supply voltage controlled by the controller.

14. A method comprising:
controlling, by a supply voltage controller of an integrated circuit, a supply voltage provided to the integrated circuit;

providing, by a clock signal generator of the integrated circuit, a first clock signal to the integrated circuit;

receiving, by the clock signal generator, a command to modify a frequency of the first clock signal;

receiving, by each of first and second counter-comparators of a frequency divider, the first clock signal and a reset signal;

generating, by the second counter-comparator, the reset signal;

generating, by the first counter-comparator, a gating signal; and generating, by a gating device of the frequency divider, a gated clock signal for clocking the integrated circuit, based on the first clock signal and the gating signal.

15. The method according to claim 14, further comprising:

counting, by the first counter-comparator, pulses of the first clock signal;

activating, by the first counter-comparator, the gating signal in response to a number of the pulses being less than or equal to a number N; and inhibiting, by the first counter-comparator, the gating signal in response to the number of the pulses being strictly greater than the number N.

16. The method according to claim 15, further comprising:

counting, by the second counter-comparator, the pulses of the first clock signal; and generating, by the second counter-comparator, in response to the number of the pulses being greater than a number D, the reset signal to reset the first and second counter-comparators.

17. The method according to claim 16, further comprising:

inhibiting, by the gating device, the gated clock signal in response to the gating signal being active; and generating, by the gating device, the gated clock signal in response to the gating signal being inhibited.

18. The method according to claim 16, further comprising varying, by the frequency divider in response to the command, the frequency of the gated clock signal with at least one series of successive divisions of the frequency of the first clock signal into successive intermediate signals of respective intermediate frequencies, each division of the at least one series being limited so as to limit a load variation presented by the integrated circuit to the supply voltage controlled by the controller.

19. The method according to claim 18, wherein a division ratio of each division of the at least one series varies from one division to another so as to avoid a frequency differential that is greater than a frequency differential limit between two successive frequencies of the series.

20. The method according to claim 19, wherein the frequency differential limit is strictly less than half the frequency of the first clock signal.

21. The method according to claim 19, wherein each frequency division comprises periodically subtracting a first number of pulses per group from a second number of pulses of the first clock signal, such that a ratio of the first number to the second number determines the division ratio of each division.

22. The method according to claim 18, wherein the at least one series of successive divisions comprises at least three divisions.

23. The method according to claim 18, wherein the frequency of the gated clock signal is modified from an initial frequency to a final frequency, and the modification comprises a decreasing series of divisions of the initial frequency of the first clock signal, restarting generation of the gated clock signal at the final frequency, and then an increasing series of divisions of the final frequency of the first clock signal.

* * * * *